United States Patent [19]

Kwon

[11] Patent Number: 5,804,514
[45] Date of Patent: Sep. 8, 1998

[54] METHOD OF PLANARIZING A FILM OF A SEMICONDUCTOR DEVICE

[75] Inventor: Byung In Kwon, Ichon-Shi, Rep. of Korea

[73] Assignee: Hyundai Electronics Industries Co., Ltd., Kyungki-do, Rep. of Korea

[21] Appl. No.: 665,895

[22] Filed: Jun. 19, 1996

[30] Foreign Application Priority Data

Jun. 20, 1995 [KR] Rep. of Korea ............. 1995-16400

[51] Int. Cl.$^6$ ...................................... B44C 1/22
[52] U.S. Cl. ................... 438/697; 216/2; 216/38
[58] Field of Search ................. 438/697; 216/2, 216/38

[56] References Cited

U.S. PATENT DOCUMENTS

| 4,523,975 | 6/1985 | Groves et al. | 156/643 |
| 4,952,274 | 8/1990 | Abraham | 438/697 |

*Primary Examiner*—Mark Chapman
*Attorney, Agent, or Firm*—Scott Harris, Esq.

[57] ABSTRACT

The present invention relates to a method of planarizing a film of a semiconductor device, which can improve the yield of the device by improving the planarizing in a way that coats a photoresist on an insulating film having a high topology, entirely exposes it using low energy, maintains the photoresist at the valley portion of the insulating film during the development process and then etches the opened insulating film using the remaining photoresist as an etching barrier.

4 Claims, 2 Drawing Sheets

METHOD OF PLANARIZING A FILM OF A SEMICONDUCTOR DEVICE

FIELD OF THE INVENTION

The present invention relates to a method of planarizing a film of a semiconductor device, more particularly to a method of planarizing an insulating film of a semiconductor device, which can improve the yield of the device by improving the planarizing in a way that coats a photoresist on an insulating film having a high topology, entirely exposes it using low energy, maintains the photoresist at the valley portion of the insulating film during the development process and then etches the opened insulating film using the remaining photoresist as an etching barrier.

BACKGROUND OF THE INVENTION

Generally, in the manufacturing process of the semiconductor device the conducting layer is formed in a bi-layered or multi-layered structure. Therefore, insulation and planarization between the conducting layers is essential. The insulating film is formed to accomplish this. As the semiconductor device becomes highly integrated, the topology of the insulating film is correspondingly increased due to higher topology of the underlying layer. In case that the conducting layer is formed on the insulating film with such a higher topology, the conducting layer will be disconnected or poorly connected, thereby decreasing the device throughput. Accordingly, the planarization of the device is very important. The conventional method of planarizing an insulating film will now be explained.

The prior art method of planarizing an insulating film used in the manufacturing process of the semiconductor device employs depositing BPSG (Boronphospho Silicate Glass) and then flowing it, or to sequentially form an insulating film and a photoresist, and then to etch it, the former having a poor planarization state due to a limit of flow process, the latter requiring lots of processing time due to the etching time for loss of the photoresist and also for planarizing, thereby making it difficult to control the etching choice rate between the photoresist and the insulating film and accordingly poor the planarization state.

SUMMARY OF THE INVENTION

Accordingly, the purpose of the present invention is to provide a method of planarizing an insulating film of a semiconductor device which can overcome the above mentioned problem in a way that coats a photoresist on an insulating film having a high topology and entirely exposes it using low energy, maintains the photoresist at the valley portion of the insulating film during the development process and then etches the opened insulating film using the remaining photoresist as an etching barrier.

To achieve the above object, a method of planarizing a film of a semiconductor, comprises the steps of: coating a photoresist on a film having a topology, thereby planarizing the film; removing a portion of the photoresist so that the photoresist coated on the valley portion of the film is maintained, thereby opening a peak portion of the film; removing the peak portion of the film; and removing the photoresist coated on the valley portion of the film.

BRIEF DESCRIPTION OF THE DRAWINGS

For fuller understanding of the nature and objects of the invention, reference should be had to the following detailed description taken in conjunction with the accompanying drawings in which.

Similar reference characters refer to similar parts through the several views of the drawings.

DESCRIPTION OF THE INVENTION

Below, the present invention will be described in detail by reference to the accompanying drawings.

FIG. 1 through FIG. 6 are sectional views for explaining a method of planarizing an insulating film of the semiconductor device in accordance with the present invention.

Figure 1:
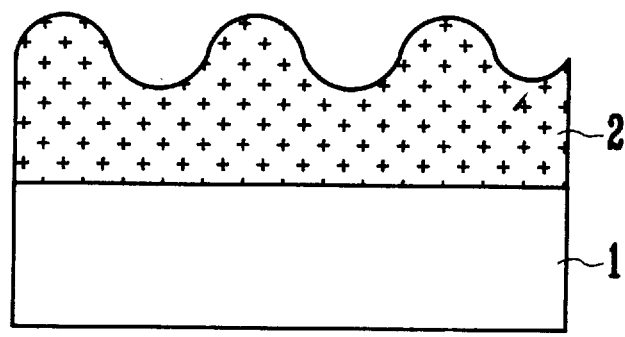
FIG. 1 through FIG. 6 are sectional views for explaining a method of planarizing an insulating film of the semiconductor device in accordance with the present invention.

FIG. 1 shows a sectional view of the device in which an insulating film 2 is formed on a wafer 1, wherein the state of the planarization is poor due to a higher topology of the underlying layer.

Figure 2:
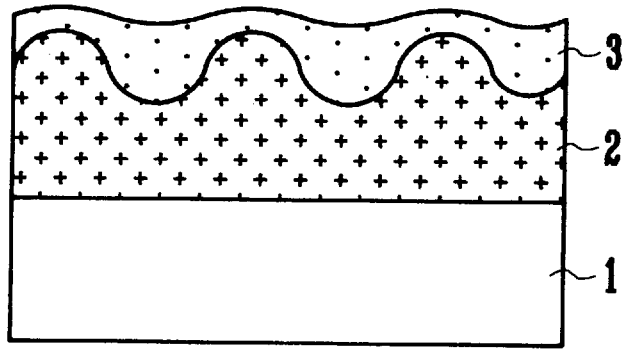

FIG. 2 shows a sectional view of the device in which a photoresist 3 is coated on the insulating film 2 having a higher topology to planarize the entire surface. If the photoresist has a low viscosity, the peak portion of the insulating film can be exposed to a light source having low energy since the thickness of the photoresist can be thinner on the peak portion of the insulating film 2.

Figure 3:
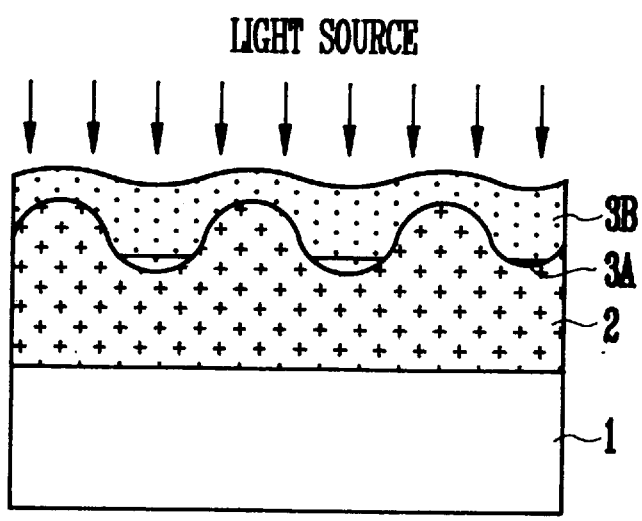

FIG. 3 shows a sectional view of the device in which the photoresist 3 is entirely exposed by the light source having low energy without exposing the photoresist 3 existing on the valley portion of the insulating film 2. Therefore, the photoresist 3 is divided into an exposed portion 3B and a non-exposed portion 3A.

Figure 4:
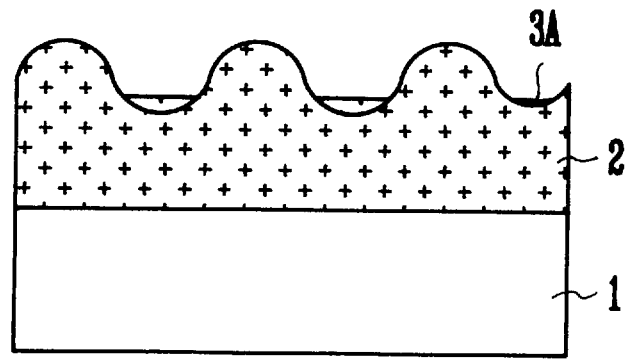

FIG. 4 shows a sectional view of the device in which the exposed portion 3B is removed during a development process, in which the peak portion of the insulating film 2 is opened and the valley portion of it is covered with the remaining photoresist.

Figure 5:
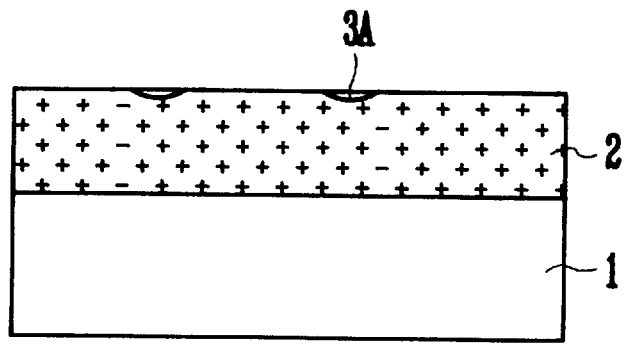

FIG. 5 shows a sectional view of the device in which the surface is planarized by etching the opened portion of the insulating film 2 to a desired depth (in this case, up to the surface of the non-exposed portion of the photoresist 3) using the non-exposed portion 3A as an etching barrier.

Figure 6:
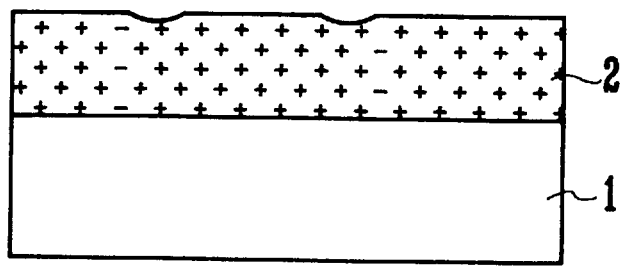

FIG. 6 shows a sectional view of the device in which the non-exposed portion 3A is removed to complete planarization of the insulating film 2. From the state of FIG. 4, the planarization, as in FIG. 6, can be obtained by controlling the etching selectivity between the photoresist and the insulating film and then etching simultaneously the insulating film at the higher and the non-exposed portion of the photoresist.

As mentioned above, the present invention can has an outstanding effect which can improve the yield of the device in a way that it coats a photoresist on an insulating film having a high topology so as to improve the planarization and entirely exposes it using low energy, which maintains the photoresist on the valley portion of the insulating film during the development process and then etches the opened insulating film using the remaining photoresist as an etching barrier.

Though the present invention discloses a method of planarizing only the insulating film, the same method can be applied to planarize other films in the semiconductor device, such as a polysilicon film, a metal film or a silicide film, in addition to the insulation film.

The foregoing description, although described in its preferred embodiment with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A method of planarizing a film of a semiconductor, comprising the steps of:

coating a photoresist on a film having a topology;

exposing said photoresist except a lower portion of said photoresist;

removing the exposed portion of said photoresist so that said photoresist coated on the valley portion of said film is maintained, thereby opening a peak portion of said film;

removing said peak portion of said film using said photoresist coated on the valley portion of said film as a mask; and removing said photoresist coated on the valley portion of said film.

2. The method of claim 1, wherein said film is an insulating layer.

3. The method of claim 1, wherein said film is polysilicon layer.

4. The method of claim 1, wherein said film is any one layer of a metal layer and a silicide layer.

* * * * *